Figure 1:
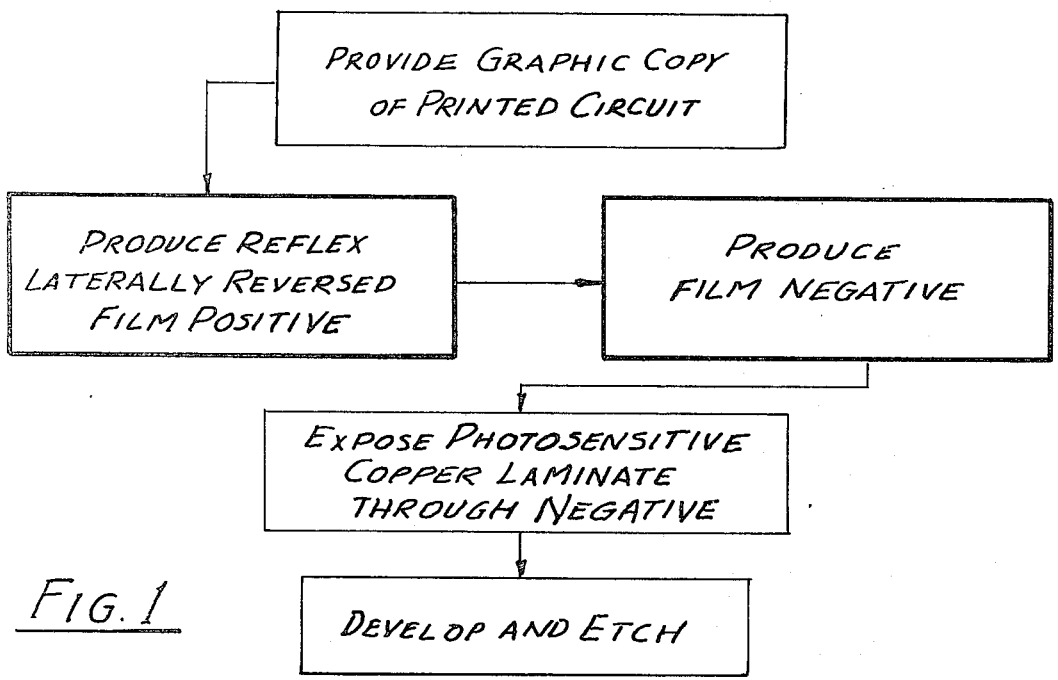

United States Patent [19]

Brown

[11] 3,945,827

[45] Mar. 23, 1976

[54] METHODS OF MAKING PRINTED CIRCUIT BOARDS UTILIZING AN IMAGE TRANSPARENCY MODE WITH HERSCHEL-EFFECT FILM

[76] Inventor: Barry David Brown, P.O. Box 192, Sparks, Nev. 89431

[22] Filed: Aug. 2, 1974

[21] Appl. No.: 494,043

[52] U.S. Cl. ............... 96/36.2; 96/27 E; 96/38.3; 96/45.2
[51] Int. Cl.² ...................... G03C 5/00; G03C 5/32
[58] Field of Search ............ 96/45.2, 27 E, 36, 36.2, 96/38.3

[56] References Cited
UNITED STATES PATENTS

| 3,253,918 | 5/1966 | Condax | 96/45.2 |
| 3,639,125 | 2/1972 | Chand | 96/38.3 |
| 3,642,477 | 2/1972 | Trusheim et al. | 96/45.2 |

*Primary Examiner*—Edward C. Kimlin

[57] ABSTRACT

The photographic method of producing a printed circuit involves preparing a film negative from a graphic replica of the printed circuit and, through the film negative, exposing a photosensitive coating on a copper laminate board which is then developed and etched. This method is improved using Herschel-effect film in two successive steps, first producing a film image of the graphic printed-circuit replica and then producing the required film negative from the first film image. One of the film images is a film positive and the other is a film negative.

8 Claims, 2 Drawing Figures

METHODS OF MAKING PRINTED CIRCUIT BOARDS UTILIZING AN IMAGE TRANSPARENCY MODE WITH HERSCHEL-EFFECT FILM

FIELD OF THE INVENTION

This invention relates to photographic methods of making printed circuits.

BACKGROUND

A popular method of making printed circuits involves preparation of a graphic image of a desired printed circuit, making a film negative of the graphic image, exposing a photosensitive emulsion on a copper-laminate board through the negative, and then developing and etching the board to yield the desired printed circuit. Preparation of the negative ordinarily requires the specialized skills and equipment of photographic laboratories. This represents an obstacle that has limited the application of the photo-etch method of making printed circuit boards to situations warranting expense and procedural delays imherent in utilizing such skills and equipment. Separately, the photographic industry has long provided high-contrast autopositive films, but such film has apparently not been used successfully if at all in providing negatives needed in the photographic method of making printed circuits.

SUMMARY OF THE INVENTION

The photographic method of producing printed circuits is improved so as to provide a film negative of the printed circuit simply and expeditiously. According to the presently preferred method, a Herschel-effect film in prefogged condition is placed in contact with a graphic copy of the desired printed circuit. The film is exposed and developed so as to yield a film positive of the printed circuit, especially a laterally reversed film positive. By contact printing, a second Herschel-effect film is placed in unfogged condition in contact with the film positive and exposed and developed so as to yield a film negative of the printed circuit. This film negative is then used with a photosensitive copper-clad board to produce the desired printed circuit whose parts have sharp outlines. The first film becomes a positive image, and the second becomes a film negative of the film positive. As will be seen, the procedure may be modified to yield a film negative in the first step, and then a film positive of the film negative, that is, the desired high-contrast sharp film negative. The procedure is one that involves only a small amount of equipment, where the equipment is relatively inexpensive and the procedure is one that can be executed without special skills and without dependence on unduly critical steps. Accordingly, anyone willing and able to make a printed circuit by the photo-etch process starting with a film negative undoubtedly has the capability of making a film negative from a graphic 1:1 replica of the printed circuit. The quality of the film negative produced in this way makes it particularly effective for use as part of the photo-etch printed-circuit making process.

ILLUSTRATIVE EMBODIMENT

The nature of the invention and its advantages and novel features will be more fully appreciated from the following detailed description of an illustrative embodiment of the invention.

Figure 2:
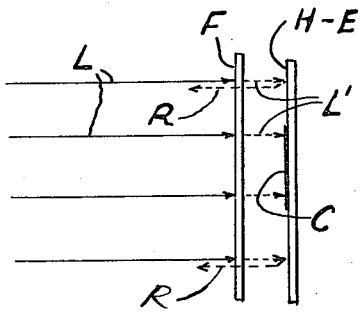

In the accompanying drawing:

FIG. 1 is a block diagram of the photo-etch process of making a printed-circuit board, the improved portion of the process being shown in heavy outlines; and FIG. 2 is a diagram illustrating the reflex printing process.

Many electronic and hobby magazines cater to the radio amateur and do-it-yourselfer. All of these magazines regularly run articles that describe how to construct projects such as radios, transmitters, digital devices, etc. The articles usually include a 1:1 graphic image of the actual printed circuit board. At present, the experimenter, wishing to obtain such a board has four alternatives:

1. Purchase the board from the author;
2. Trace the pattern onto a copper-clad board and, using the tracing as a guide, apply a paint or dry transfer etch resist to the board. The board is then etched with ferric chloride in the usual manner;
3. Trace the pattern onto a clear plastic sheet using ink or precut drafting patterns, then make or obtain a contact negative. Use the negative to expose a sensitized copper-clad insulating board. Develop the resist image, then etch in the usual way; and
4. Have the printed image professionally photographed to obtain the necessary 1:1 high contrast negative, then expose and etch the board as before.

FIG. 1 of the drawing shows a non-professional adaptation of the fourth process of producing a printed-circuit board, incorporating the present invention. Starting with an actual-size or 1:1 graphic rendition of the desired printed circuit, a film negative of the printed circuit is produced in two steps, discussed in detail below. The negative is applied to a photographically sensitive emulsion on a copper-clad laminate, it is exposed to light and developed, the unaffected areas of emulsion are removed by washing, and the bared areas of copper are etched away.

With the present invention, the hobbyist can obtain a high contrast negative without benefit of camera or darkroom and with commercially available copy films. This high contrast negative is essential to the follow-on process of exposing and etching a board. A lower contrast negative of high density will require much longer exposure times and will usually make a board with poor circuit line definition: ragged edges, "spreading," reduced line clearances.

High contrast films suitable for the present invention are commercially available under the class of duplicating, direct positive and copy films, for example Kodak Autopositive film 2577. These films exhibit the Herschel Effect, which is explained as follows.

When a blue-sensitive silver halide emulsion is exposed to blue or UV light, a latent image is produced. This is believed to be composed of photon induced specks of charged electrons trapped at sensitivity centers in the silver halide crystals. A sensitivity center can be either a silver sulphide molecule or a discontinuity in or on the crystal. These electrons attract and trap free interstitial silver ions wandering through the lattice. When an ion is trapped, it is neutralized and becomes a colloidal silver atom. This atom is a "seed" that enhances further photolytic silver production. Until 4 or 5 of these atoms have clustered, the action is reversible: the silver specks can recombine with local free halogen ions and again become unexposed, so to speak. (It can still be bleached out or destroyed by a phenomenon known as the Herschel Effect.) Silver sulphide particles can serve as sensitivity centers so if the film has been heavily sulphur sensitized, many more centers exist. The photolytic build-up of silver is thus more diffused and the latent image formation is reversible to a much greater degree.

If such a film with a latent image is exposed to light of long wavelength or infrared energy that is beyond its photosensitive range, the latent image is destroyed or bleached away. The mechanism is generally accepted to be as follows: a quantum of long wavelength energy is absorbed by a silver atom to form a silver ion plus an electron kicked away into the silver halide conduction band. The silver ion thus formed then wanders off through the lattice to become an interstitial $Ag^+$. The foregoing is the Herschel Effect. This obviously must go on to some slight extent whenever a film emulsion is exposed, but the reactions that form silver atoms are much more plentiful in usual photographic film and the Herschel Effect is masked. The Herschel Effect is more fully explained at pages 155–160 in "The Theory of the Photographic Process" by Mees-James.

As shown in FIG. 1, the process of making a printed circuit starts with providing a 1:1 graphic image of the printed circuit. Two slow speed, high contrast copy films prominently exhibiting the Herschel effect are also provided.

A first Herschel-Effect film is applied with its emulsion side against the graphic printed-circuit image in a contact printing frame. In the preferred procedure, this first film is sensitive to blue or actinic light and it is in uniformly and suitably fogged condition as supplied by the manufacturer for effective use in producing laterally reversed film positives by reflex exposure. The arrangement for reflex exposure is represented in FIG. 2. (The elements represented in FIG. 2 are shown separated for clarity, but in a contact printing frame they are in contact with one another.) Long wave-length light is used, provided as by means of one light bulb or a cluster of light bulbs and a yellow or yellow-green filter F, having a pass band beyond 560 m$\mu$. The light L and filter F provide incident rays L' that pass through the Herschel-Effect film H-E and reach the graphic image I of the printed circuit. Rays L' must not be in the sensitivity band of the film. Unsensitized silver chloride is insensitive beyond 420 m$\mu$ and unsensitized silver bromide is insensitive beyond 470 m$\mu$. Rays L' that strike black image areas C representing the circuit conductors are absorbed. Rays L' that strike white areas of the graphic image are reflected as rays R which pass through film H-E a second time.

The incident light L' passing through all areas of the film causes a degree of reversal or bleaching of the initial fogged film condition. The added effect of reflected rays R completes the bleaching action. This leaves the film areas opposite image areas C fogged, yielding a film positive upon development. Advantageously the first film is applied with its emulsion side E facing the graphic image during the exposure. Upon development, the result is a laterally reversed film replica of the graphic image.

Next, the film positive is applied to the second sheet of Herschel-Effect copy film in a contact printing frame, preferably with its emulsion side facing the emulsion side of the second film. However, since the film as sold is fogged for producing positives, it is given a preparatory all-over uniform bleaching exposure to long wavelength light so as to be unfogged. The exposure should be 10 percent longer than needed to clear the film. The second light-sensitive film is exposed to white or blue light through the film positive.

Upon development, the second film constitutes a high-contrast negative, with opaque black areas and clear areas, well suited for producing high quality printed circuits by ensuing photographic and etching steps. The printed circuits are free of ragged edges, spreading, and reduced line clearances as mentioned above. This process requires only ordinary and inexpensive equipment, and may be carried out in subdued light since the film is quite insensitive. A darkroom and a sophisticated photographic laboratory are quite unnecessary. The film is available commercially, and the exposure times and light intensities as specified by the film manufacturer are relatively non-critical.

In the procedure above, the first exposure yields a film positive of the graphic image, and the second yields a high-contrast film negative. In a modification, it is feasible to reverse this sequence, in a sense. In the first step of the modified procedure, a film negative of the graphic printed circuit image is produced by the reflex exposure arrangement shown in FIG. 2. In this modification, the first film is sensitive to blue or actinic light. The characteristics of Herschel-Effect copying film are highly desirable, and where the available film is fogged by the manufacturer for intended use in making positives, the film is here unfogged or bleached by exposing it to long wavelength light, for a period 10 percent longer than that needed to completely bleach the film. This is a preliminary operation. The reflex exposure step follows, and the film is developed. The resulting negative lacks the opaque areas and clear areas important in a negative for making printed circuit boards by the photo-etch process. Accordingly, a further step is needed to provide the desired negative. For this purpose, another sheet of Herschel-Effect copy film is applied in contact with the film negative in a conventional contact-printing operation, involving exposure of the second sheet of Herschel-Effect film to long wavelength light through the film negative. The second film becomes a positive replica of the image of the first film, and thus the second film becomes a high-contrast negative of the graphic image, and is effective for making printed circuits by the ensuing photo-etch procedure.

The modification described above involves a preparatory step of all-over exposure of the first sheet of copy film to long wavelength light, for rendering the film sensitive to actinic or blue light. This step requires care, to attain the degree of reversal needed for making a film negative by reflex exposure. In this respect, the first-described procedure is easier to perform and is preferred.

The foregoing represents the presently preferred embodiments of the invention, but because the described methods are susceptible of various further modifications in matters of detail, the invention should be construed broadly in accordance with its full spirit and scope.

What is claimed is:

1. In the method of producing a printed circuit board by preparing a film negative of the desired printed circuit, assembling the film negative to a photosensitive coating on a copper-clad laminate, exposing the coating to light through the negative, developing the coating to produce bare and resistcoated areas, and etching away the bare areas of the copper-clad laminate, the improvement in the preparation of the film negative which comprises the steps of applying a first Herschel-Effect silver halide emulsion film to a graphic image of the desired printed circuit, exposing and developing the first film so as to yield a film copy of the graphic image, applying a second Herschel-Effect silver halide emulsion film to said film copy of the graphic image, and exposing and developing the second film, one of said films being initially fogged when it is exposed so as to yield a positive replica of the image to which it is exposed, the other of the films being initially unfogged when it is exposed and developed so as to yield a negative replica of the image to which it is exposed.

2. The method of claim 1, wherein the first film is applied with its emulsion side facing the graphic image and exposed refexively so that when it is developed, it is a laterally reversed film replica of the graphic image.

3. The method in accordance with claim 1, wherein the first film is initially fogged uniformly but reversibly when it is exposed so as to yield a film positive of the graphic image when it is developed, and wherein the second film is initially unfogged when it is exposed so as to yield a film negative of the film positive when it is developed.

4. The method of claim 1, wherein the first film is applied in initially fogged condition to the graphic image with the emulsion side of the first film facing the graphic image and exposed reflexively and developed so as to yield a laterally reversed film positive of the graphic image, and wherein the second film is applied to the film positive in initially unfogged condition and exposed and developed to yield a film negative.

5. The method in accordance with claim 1, wherein the first film is applied in unfogged condition to the graphic image with the emulsion side of the first film facing the graphic image and is exposed reflexively and developed so as to yield a first film negative and wherein the second film in initially fogged condition is exposed through the first film negative to bleaching light.

6. The method of claim 1, wherein the first film is applied with its emulsion side facing the graphic image when it is exposed, so that when it is developed it is a laterally reversed film replica of the graphic image.

7. The method in accordance with claim 1, wherein the first Herschel-Effect film is in fogged condition when it is exposed as aforesaid, and wherein the second Herschel-Effect film is in unfogged condition when it is exposed as aforesaid.

8. The method in accordance with claim 1, wherein the first Herschel-Effect film is in unfogged condition when it is exposed as aforesaid, and wherein the second Herschel-Effect film is in fogged condition when it is exposed as aforesaid.

* * * * *